United States Patent
Cho et al.

(10) Patent No.: US 7,112,486 B2
(45) Date of Patent: Sep. 26, 2006

(54) METHOD FOR FABRICATING SEMICONDUCTOR DEVICE BY USING RADICAL OXIDATION

(75) Inventors: Heung-Jae Cho, Kyoungki-do (KR); Se-Aug Jang, Kyoungki-do (KR); Kwan-Yong Lim, Kyoungki-do (KR); Jae-Geun Oh, Kyoungki-do (KR); Hong-Seon Yang, Kyoungki-do (KR); Hyun-Chul Shon, Kyoungki-do (KR)

(73) Assignee: Hynix Semiconductor Inc., (KR)

( * ) Notice: Subject to any disclaimer, the term of this patent is extended or adjusted under 35 U.S.C. 154(b) by 120 days.

(21) Appl. No.: 11/019,579

(22) Filed: Dec. 20, 2004

(65) Prior Publication Data

US 2006/0008996 A1    Jan. 12, 2006

(30) Foreign Application Priority Data

Jul. 6, 2004    (KR) ...................... 10-2004-0052268

(51) Int. Cl.
   *H01L 21/8242*    (2006.01)
(52) U.S. Cl. ...................... 438/241; 438/287; 438/981; 257/E21.662
(58) Field of Classification Search ................ 438/241; 257/E21.662
   See application file for complete search history.

(56) References Cited

U.S. PATENT DOCUMENTS

| | | | | |
|---|---|---|---|---|
| 5,290,725 A | * | 3/1994 | Tanaka et al. | 438/241 |
| 6,482,692 B1 | * | 11/2002 | Kawasaki et al. | 438/241 |
| 2003/0228725 A1 | * | 12/2003 | Tsujikawa et al. | 438/287 |

* cited by examiner

*Primary Examiner*—Chandra Chaudhari
(74) *Attorney, Agent, or Firm*—Blakely Sokoloff Taylor & Zafman (57) ABSTRACT

The present invention provides a method for fabricating a semiconductor device having a dual gate dielectric structure capable of obtaining a simplified process and improving device reliability. The method includes the steps of: forming an insulation layer on a substrate; forming a nitride layer on the insulation layer; selectively etching the nitride layer in a predetermined region of the substrate; performing a radical oxidation process to form an oxide layer on the insulation layer and the etched nitride layer; forming a gate conductive layer on the oxide layer; and performing a selective etching process to the gate conductive layer, the oxide layer, the nitride layer and the insulation layer, so that the first dielectric structure formed in the predetermined region includes the insulation layer and the oxide layer and the second gate dielectric structure formed in regions other than the predetermined region includes the insulation layer, the nitride layer and the oxide layer.

18 Claims, 8 Drawing Sheets

METHOD FOR FABRICATING SEMICONDUCTOR DEVICE BY USING RADICAL OXIDATION

FIELD OF THE INVENTION

The present invention relates to a process for fabricating a semiconductor device; and more particularly, to a method for forming a dual gate dielectric structure in a non-volatile dynamic random access memory (NVDRAM) device.

DESCRIPTION OF RELATED ARTS

As for a conventional dynamic random access memory (DRAM) device, if power is not supplied, saved information is destroyed. That is, in the conventional DRAM devices, a transistor serves as a switch and a capacitor serves a role in saving data. Accordingly, the conventional DRAM device is a volatile memory type which data is automatically destroyed if a supply of the power is stopped. In order to overcome this disadvantage of the conventional DRAM device and to realize both a fast reading and writing capability and a non-volatile capability of a flash memory into a single DRAM, a study about a non-volatile DRAM (NVDRAM) has been developed. The NVDRAM is developed to have a transistor serving a role in saving data and thus, if the NVDRAM is turned off, the data saved in the capacitor is transferred to and saved in the transistor. As a result, the NVDRAM is allowed to have a similar property to the flash memory having a non-volatile property. On the contrary, the NVDRAM is turned on again, the data saved in the transistor is transferred to the capacitor, thereby carrying out an original function of the DRAM.

The NVDRAM having the DRAM characteristic and the flash memory characteristic has a fast reading capability and the non-volatile capability of the flash memory along with the fast reading and writing capability of the DRAM. Accordingly, the NVDRAM can be widely used in various fields such as a cellular phone, a personal digital assistant (PDA) and a system on chip (SoC).

A cell transistor of the NVDRAM is a gate dielectric material, thereby being formed in a structure of an oxide layer/a nitride layer/an oxide layer (ONO). Herein, the nitride layer is capable of trapping an electric charge. Meanwhile, the gate dielectric material of the transistor formed in a peripheral region uses a single silicon oxide layer ($SiO_2$), thereby operating in low voltage and power in high-speed. As for the NVDRAM, the cell transistor and the peripheral transistor have the gate dielectric materials having different structures and properties from each other, and thus the gate dielectric material is called a dual gate dielectric material.

FIGS. 1A to 1D are cross-sectional views illustrating a process for fabricating a conventional NVDRAM. With reference to FIGS. 1A to 1D, a conventional process for forming a silicon/oxide/nitride/oxide/silicon (SONOS) structure will be examined.

Figure 1A:
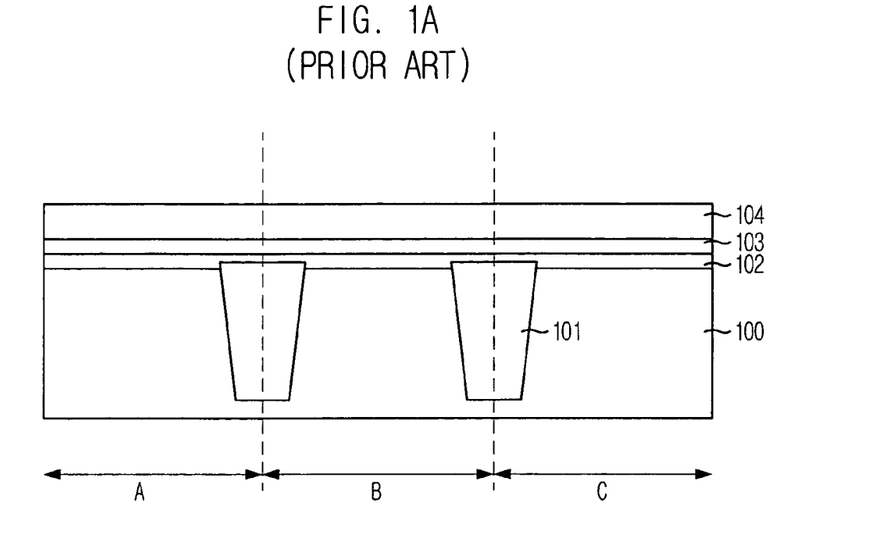
FIGS. 1A to 1D are cross-sectional views illustrating a conventional method for forming a dual gate dielectric structure in a non-volatile dynamic random access memory (NVDRAM)

Referring to FIG. 1A, a device isolation layer 101 is locally formed in a substrate 100. Then, a direct tunneling oxide layer 102, a silicon nitride layer 103 and a chemical vapor deposition (CVD) oxide layer 104 are sequentially deposited thereon. Herein, the CVD oxide layer 104 is an oxide layer formed by using a CVD method. The device isolation layer 101 is formed by using one of a local oxidation of silicon method and a shallow trench isolation method.

Figure 1B:
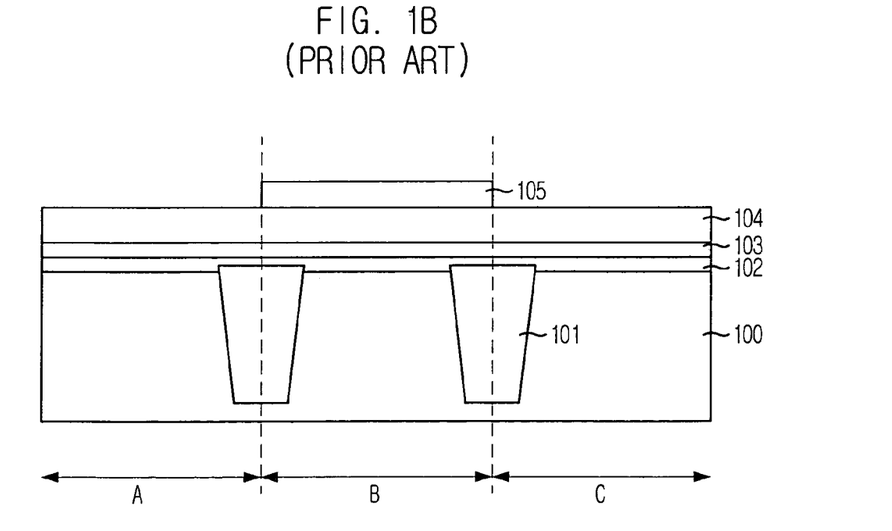

Subsequentially, referring to FIG. 1B, a photoresist pattern 105 is formed on the CVD oxide layer 104, thereby masking a cell region B and opening a plurality of peripheral regions A and C.

The photoresist pattern 105 is an etch barrier that makes the silicon nitride layer 103 and the CVD oxide layer in the cell region B remains.

Figure 1C:
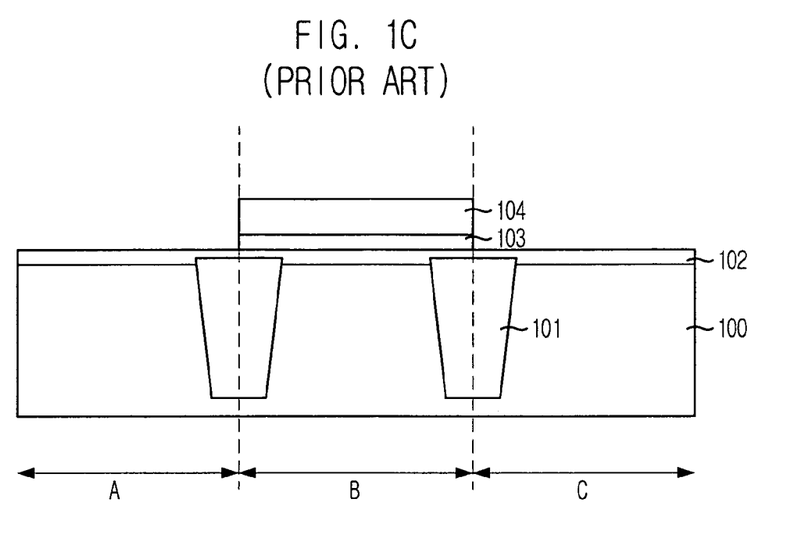

Subsequentially, referring to FIG. 1C, the silicon nitride layer 103 and the CVD oxide layer 104 are selectively etched by using the photoresist pattern 105 as an etch mask, so that the silicon nitride layer 103 and the CVD oxide layer 104 remain in the cell region B. Afterwards, the photoresist pattern 105 is removed and then, a cleaning process is performed.

Figure 1D:
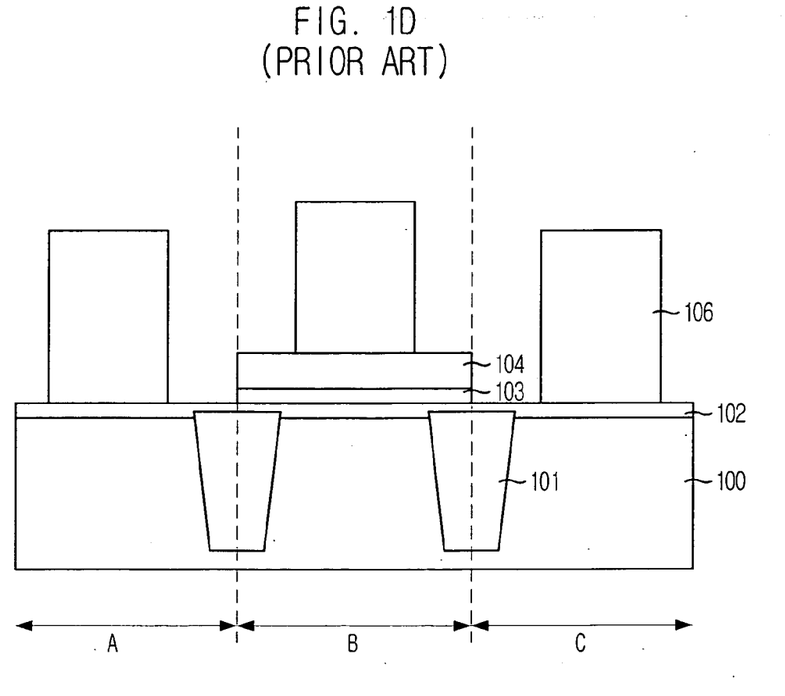

Referring to FIG. 1D, a gate electrode 106 is formed on the above resulting substrate structure. The gate electrode 106 is formed by mainly using a polysilicon layer.

After completing all of the above processes, an oxidation process and a re-oxidation process are employed.

Figure 2:
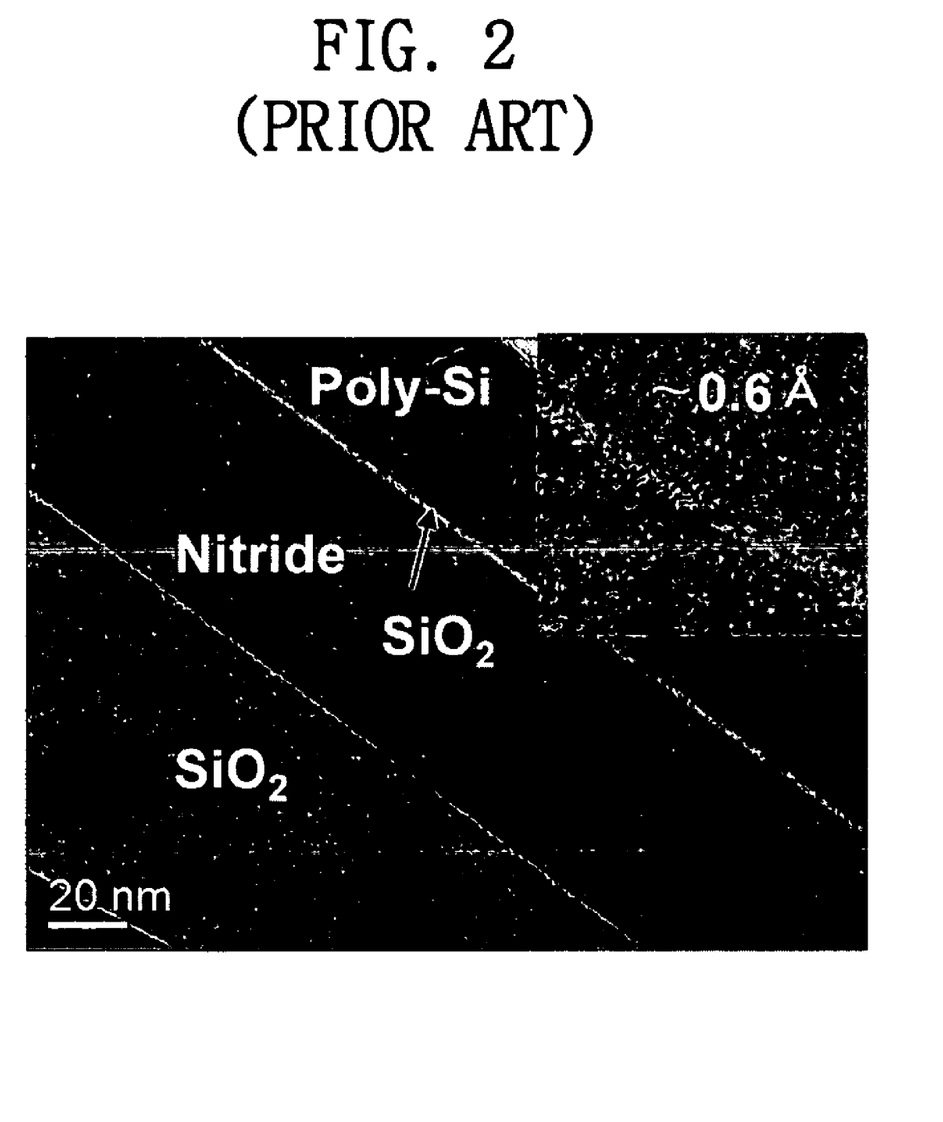
FIG. 2 is a micrograph of transmission electron microscopy (TEM) showing an oxidized nitride layer through employing a conventional thermal oxidation method.

FIG. 2 is a micrograph of transmission electron microscopy (TEM) showing an oxidized nitride layer through employing a conventional thermal oxidation method.

As mentioned above, as for forming the conventional dual gate dielectric structure, a top gate dielectric layer is formed by using the CVD oxide layer 104, and an etching process is employed for removing the silicon nitride layer 103 and the CVD oxide layer 104 placed in the plurality of peripheral regions A and C. Accordingly, the direct tunneling oxide layer 102 in the plurality of peripheral regions A and C becomes damaged during the selective etching process and thus, the gate dielectric structure of a peripheral transistor loses reliability.

In order to prevent the direct tunneling oxide layer 102 from a deterioration caused by the etch damage, the etch damage of the direct tunneling oxide layer 102 should be recovered through performing a thermal oxidation process again after the etching process.

As a result, the conventional method for fabricating the dual gate dielectric structure may degrade reliability of the gate electric structure and complicate the gate dielectric structure formation process.

SUMMARY OF THE INVENTION

It is, therefore, an object of the present invention to provide a method for fabricating a semiconductor device with a dual gate dielectric structure capable of obtaining a simplified process and improving device reliability.

In accordance with one aspect of the present invention, there is provided a method for fabricating a semiconductor device with a dual dielectric structure including a first gate dielectric structure and a second gate dielectric structure, comprising the steps of: forming an insulation layer on a substrate; forming a nitride layer on the insulation layer; selectively etching the nitride layer in a predetermined region of the substrate; performing a radical oxidation process to form an oxide layer on the insulation layer and the etched nitride layer; forming a gate conductive layer on the oxide layer; and performing a selective etching process to the gate conductive layer, the oxide layer, the nitride layer and the insulation layer, so that the first dielectric structure formed in the predetermined region includes the insulation layer and the oxide layer and the second gate dielectric structure formed in regions other than the predetermined region includes the insulation layer, the nitride layer and the oxide layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

FIG. 2 is a micrograph of transmission electron microscopy (TEM) showing a gate dielectric structure, wherein a poly-silicon layer is deposited after a silicon nitride layer is oxidized by a thermal oxidation method. As shown, it is observed that a silicon oxide ($SiO_2$) layer is hardly grown on the silicon nitride layer.

Figure 3:
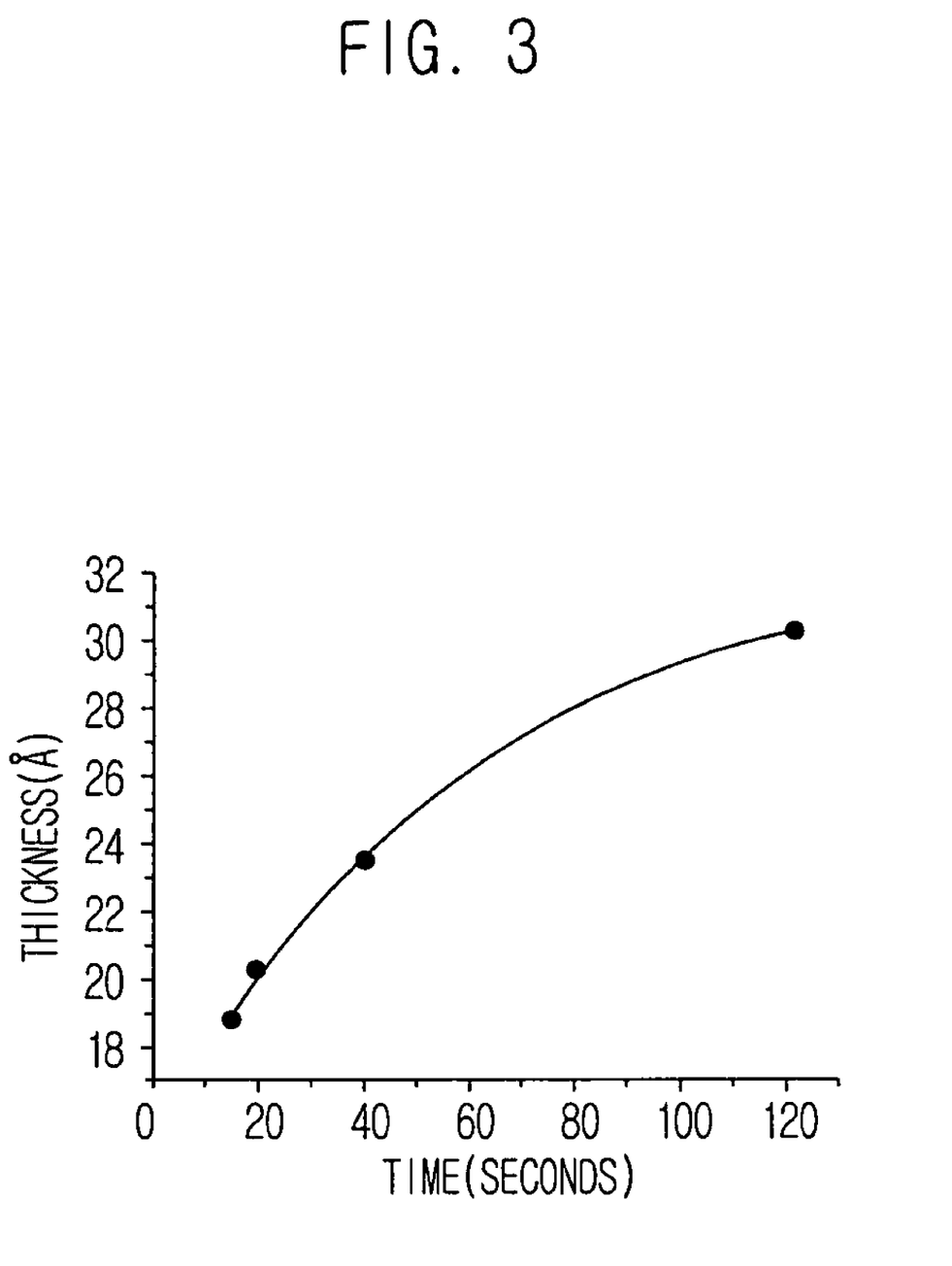
FIG. 3 is a graph illustrating a thickness of an oxide layer grown on a nitride layer with respect to a proceeding time of a radical oxidation method in accordance with the present invention.

FIG. 3 is a graph illustrating a thickness of an oxide layer grown on a nitride layer with respect to a proceeding time of a radical oxidation method. As the oxidation becomes longer, the thickness of the silicon oxide ($SiO_2$) on nitride layer increases.

Figure 4:
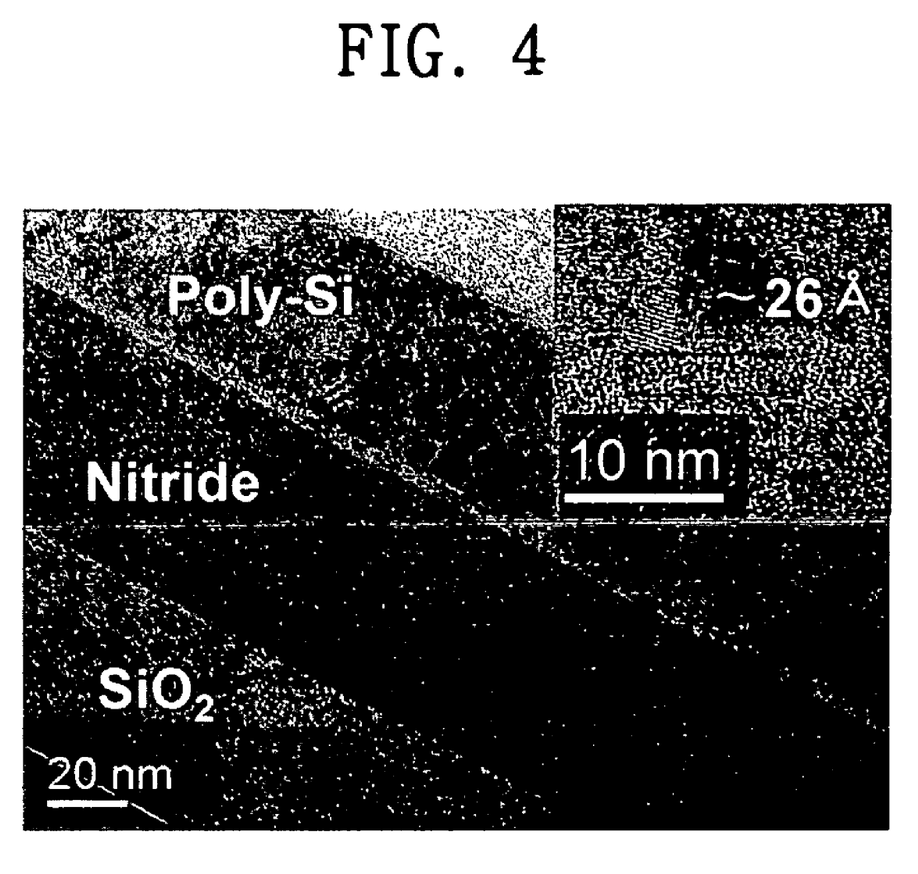
FIG. 4 is a micrograph of transmission electron microscopy (TEM) showing an oxidized nitride layer through a radical oxidization method in accordance with the present invention.

FIG. 4 is a micrograph of transmission electron microscopy (TEM) showing a nitride layer oxidized by a radical oxidation method. In comparison with FIG. 2, it is identified that the oxide layer, i.e., the $SiO_2$ layer, is thickly grown on the polysilicon layer.

FIGS. 5A to 5F are cross-sectional views illustrating a method for forming a dual gate dielectric structure by using a radical oxidation method in accordance with the present invention.

Figure 5A:
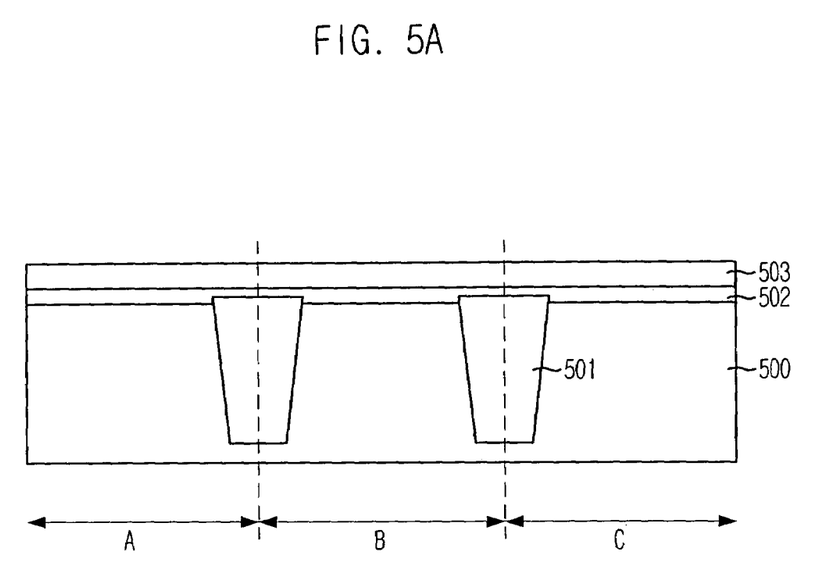
FIGS. 5A to 5F are cross-sectional views illustrating method for fabricating a dual gate dielectric structure in a non-volatile dynamic random access memory device (NVDRAM) in accordance with the present invention.

Referring to FIG. 5A, a device isolation layer 501 is locally formed in an active region which defines a plurality of peripheral regions A and C and a cell region B. The device isolation layer 501 is formed by using one of a local oxidation of silicon method and a shallow trench isolation method.

Subsequently, a first oxide layer 502 and a silicon nitride layer 503 are sequentially deposited on a substrate 500. At this time, a thickness of the first oxide layer 502 ranges from approximately 20 Å to approximately 100 Å. The first oxide layer 502 can be formed by growing a $SiO_2$ layer through a high temperature thermal process or a radical oxidation method, or by depositing a $SiO_2$ layer. Furthermore, the first oxide layer 502 can also be formed by using a high-k dielectric material having a higher dielectric constant than the $SiO_2$ layer. The silicon nitride layer 503 is deposited by using one of a plasma enhanced chemical vapor deposition (PECVD) method, a low pressure chemical vapor deposition (LPCVD) method and an atomic layer deposition (ALD) method. At this time, the silicon nitride layer 503 has a thickness ranging from approximately 100 Å to approximately 200 Å.

Figure 5B:
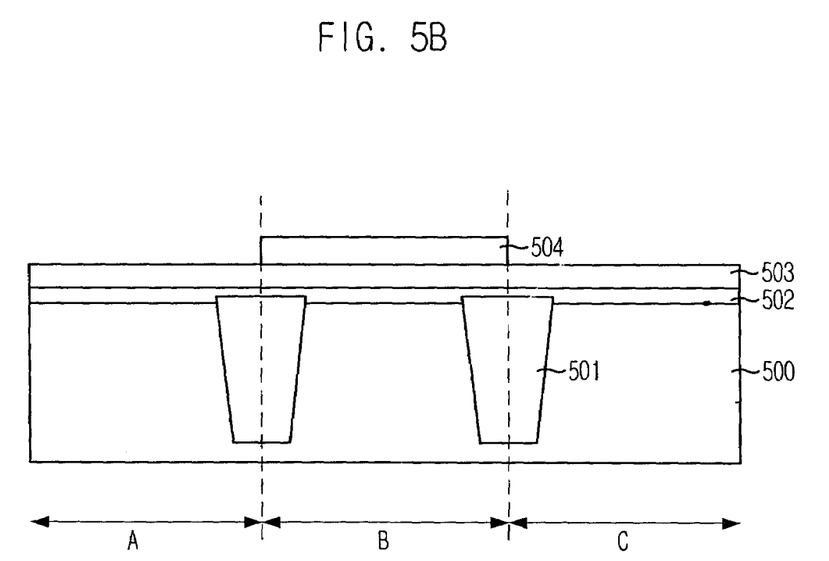

Subsequently, referring to FIG. 5B, a photoresist pattern 504 which opens the peripheral regions A and C and makes the cell region B is formed on the silicon nitride layer 503.

Figure 5C:
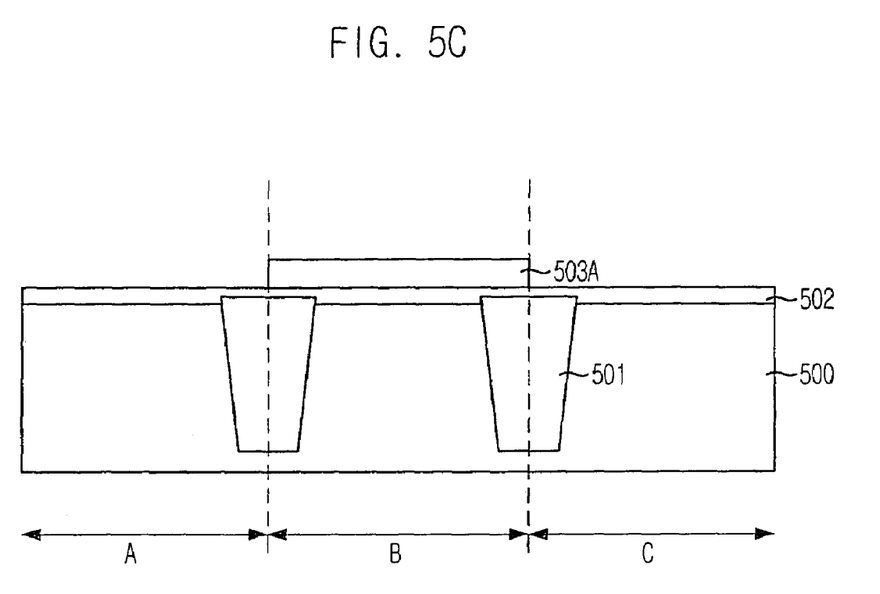

Subsequently, referring to FIG. 5C, the first oxide layer 502 and the silicon nitride layer 503 are subjected to a selective etching process by using a photoresist pattern 504 as an etch barrier. After the selective etching process, a firstly patterned silicon nitride layer 503A remaining only in the cell region B is obtained. Depending on various purposes, even the first oxide layer 502 can be selectively removed. At this time, a dry etching method and/or a wet etching method can be employed as a method for selectively etching the silicon nitride layer 503 shown in FIG. 5B. In order to selectively etch the first oxide layer 502, a wet etching method can be employed. Afterwards, the photoresist pattern 504 is removed, and a cleaning process is performed thereafter.

Figure 5D:
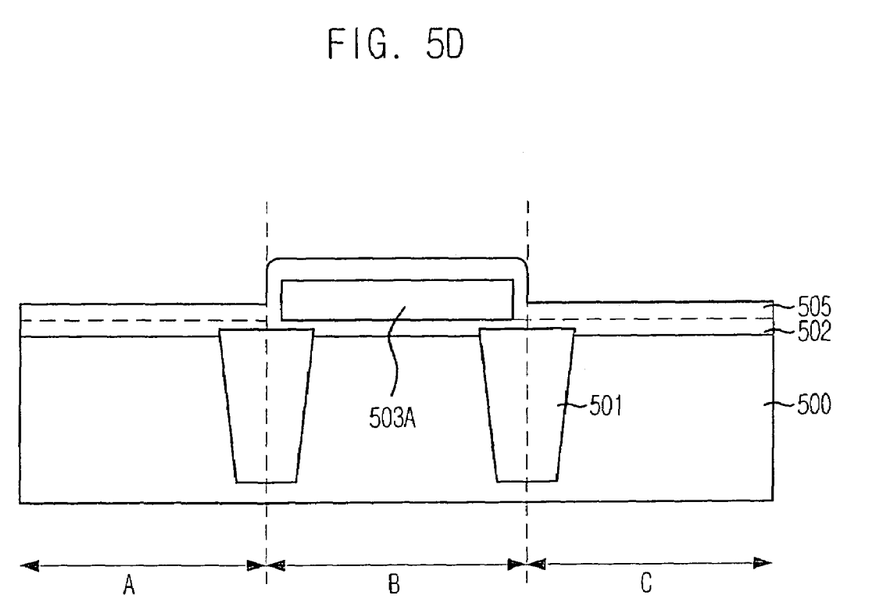

Referring to FIG. 5D, a second oxide layer 505 is grown on the above resulting substrate structure by performing a radical oxidation process. The second oxide layer 505 is formed with a predetermined thickness not only on the first oxide layer 502 in the peripheral regions A and C but also on the firstly patterned silicon nitride layer 503A in the cell region B. At this time, for the radical oxidation process, a gas selected from a group consisting of $O_2$, $H_2O$, $D_2O$, NO and $N_2O$ is supplied in an atmosphere of Ar or Xe plasma, thereby forming radical O. Herein, radical H, D, and N can also be formed under the same recipe.

Furthermore, if gases including H and O and gases including D and O are provided to a chamber at a temperature ranging from approximately 800° C. to approximately 1,000° C. and a pressure ranging from approximately 0.1 Torr to approximately 10 Torr, thereby respectively generating $H_2O$ or $D_2O$ along with radical O. This radical O has a very strong oxidation capability and thus, the second oxide layer 505 can be grown not only on the first oxide layer 502 but also on the firstly patterned silicon nitride layer 503A. At this time, a thickness of the second oxide layer 505 ranges from approximately 20 Å to approximately 100 Å. Also, it should be noted that the second oxide layer is made of a material selected from $SiO_2$ and high-k dielectric material of which a dielectric constant is greater than that of $SiO_2$.

Figure 5E:
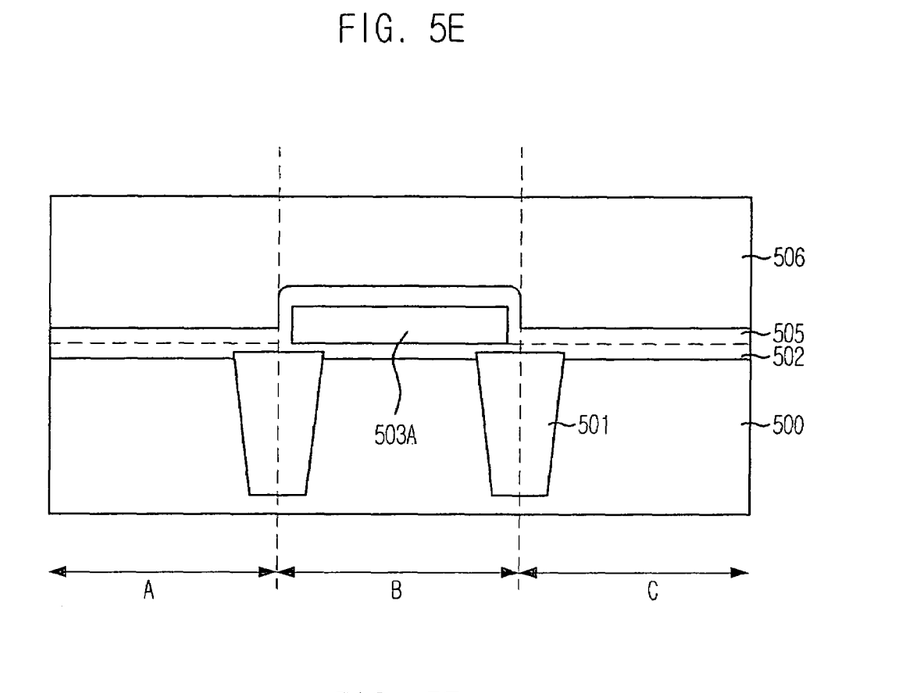

Subsequently, referring to FIG. 5E, a gate conductive layer 506 is deposited on the second oxide layer 505. At this time, the gate conductive layer 506 can be formed by using a material selected from a group consisting of polysilicon, metal/polysilicon and metal silicide/polysilicon.

Figure 5F:
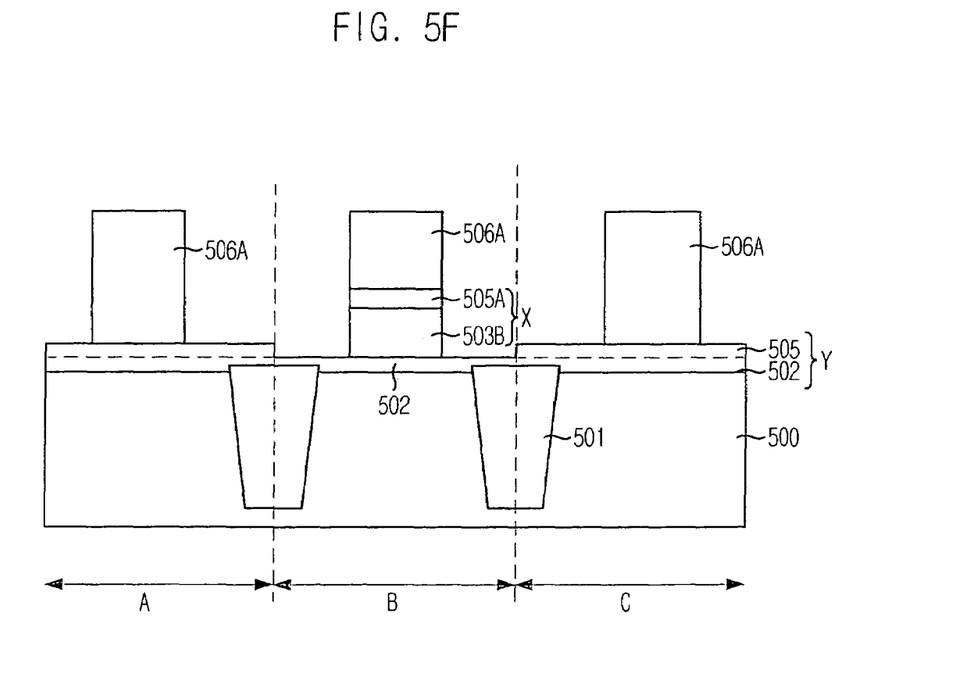

Referring to FIG. 5F, a gate electrode 506A and a first gate dielectric structure X and a second gate dielectric structure Y are formed by employing a gate mask process and an etch process. Herein, a reference numeral 506A expresses a patterned gate conductive layer which functions as the gate electrode and reference numerals 503B and 505A denote a secondly patterned silicon nitride layer and a patterned second oxide layer. At this time, the first oxide layer 502 is not yet etched. In more detail of the gate dielectric structures X and Y, in the peripheral regions A and C, the first oxide layer 502 and the second oxide layer 505 constitutes the first gate dielectric structure Y and, in the cell region B, the secondly patterned silicon nitride layer 503B and the patterned second nitride layer 505A are stacked on the first oxide layer 502, thereby forming the first gate dielectric structure X.

For the dual gate dielectric structure including the first and the second gate dielectric structures X and Y in accordance with the present invention, a top gate dielectric layer, i.e., the second oxide layer, is grown by employing the radical oxidation process instead of a chemical vapor deposition (CVD) method. At this time, in contrast to the first gate dielectric structure X having a structure of ONO, the second gate dielectric structure includes only the oxide layer. Also, in the peripheral region, the radical oxidation process is performed under a state that the silicon nitride layer is removed. Thus, an etch damage on the second gate dielectric material in the peripheral circuit transistor can be recovered.

Consequently, the present invention makes it possible to recover the etch damage and form the top gate dielectric layer at the same time. As a result, there is provided effects of simplifying the process and improving reliability of the semiconductor device.

When a transistor having an ONO gate dielectric structure is integrated with a transistor having a gate dielectric structure having only oxide layers, a top oxide layer of the ONO gate dielectric structure is formed by using a radical oxidation process under a state that a lower nitride layer is etched. Accordingly, the present invention simplifies a gate dielectric structure formation process and improves reliability of the semiconductor device.

The present application contains subject matter related to the Korean patent application No. KR 2004-0052268, filed in the Korean Patent Office on Jul. 6, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device with a dual dielectric structure including a first gate dielectric structure and a second gate dielectric structure, comprising the steps of:
   forming an insulation layer on a substrate;
   forming a nitride layer on the insulation layer;
   selectively etching the nitride layer in a predetermined region of the substrate;
   performing a radical oxidation process to form an oxide layer on the insulation layer and the etched nitride layer;
   forming a gate conductive layer on the oxide layer; and
   performing a selective etching process to the gate conductive layer, the oxide layer, the etched nitride layer and the insulation layer, so that the first dielectric structure formed in the predetermined region includes the insulation layer and the oxide layer and the second gate dielectric structure formed in regions other than the predetermined region includes the insulation layer, the etched nitride layer and the oxide layer.

2. The method of claim 1, wherein the radical oxidation process is performed by providing a gas selected from a group consisting of $O_2$, $H_2O$, $D_2O$, NO and $N_2O$ in an atmosphere selected from an Ar plasma and a Xe plasma.

3. The method of claim 1, wherein the radical oxidation process is performed at a temperature ranging from approximately 800° C. to approximately 1,000° C. and a pressure ranging from approximately 0.1 Torr to approximately 10 Torr by providing $H_2$ and $O_2$, individually.

4. The method of claim 1, wherein the oxide layer is formed with a thickness ranging from approximately 20 Å to approximately 100 Å.

5. The method of claim 1, wherein the insulation layer is made of an oxide material formed by employing one of a thermal growth process and a deposition process.

6. The method of claim 1, wherein the oxide layer is one of $SiO_2$ and a high k-dielectric material of which a dielectric constant is greater than that of $SiO_2$.

7. The method of claim 1, wherein the oxide layer is grown by a radical oxidation process.

8. The method of claim 1, wherein the nitride layer disposed in the predetermined region is etched by using one of a wet etching process and a dry etching process.

9. The method of claim 1, wherein the gate conductive layer is made of a material selected from a group consisting of polysilicon, metal/polysilicon and metal silicide/polysilicon.

10. A method for fabricating a semiconductor device with a dual dielectric structure including a first gate dielectric structure and a second gate dielectric structure, comprising the steps of:
    forming an insulation layer on a substrate;
    forming a nitride layer on the insulation layer;
    selectively etching a first region of the nitride layer and the insulation layer;
    performing a radical oxidation process to form an oxide layer on the etched nitride layer and the insulation layer;
    forming a gate conductive layer on the oxide layer; and
    performing a selective etching process to the gate conductive layer, the oxide layer, the etched nitride layer and the insulation layer, so that the first dielectric structure formed in the first region includes the insulation layer and the oxide layer and the second gate dielectric structure formed in regions other than the first region includes the insulation layer, the etched nitride layer and the oxide layer.

11. The method of claim 10, wherein the radical oxidation process is performed by providing a gas selected from a group consisting of $O_2$, $H_2O$, $D_2O$, NO and $N_2O$ in an atmosphere selected from an Ar plasma and a Xe plasma.

12. The method of claim 10, wherein the radical oxidation process is performed at a temperature ranging from approximately 800° C. to approximately 1,000° C. and a pressure ranging from approximately 0.1 Torr to approximately 10 Torr by providing $H_2$ and $O_2$, individually.

13. The method of claim 10, wherein the oxide layer is formed with a thickness ranging from approximately 20 Å to approximately 100 Å.

14. The method of claim 10, wherein the insulation layer is made of an oxide material formed by employing one of a thermal growth process and a deposition process.

15. The method of claim 10, wherein the oxide layer is one of $SiO_2$ and a high k-dielectric material of which a dielectric constant is greater than that of $SiO_2$.

16. The method of claim 10, wherein the oxide layer is grown by a radical oxidation process.

17. The method of claim 10, wherein the nitride layer disposed in the first region is etched by using one of a wet etching process and a dry etching process.

18. The method of claim 10, wherein the gate conductive layer is made of a material selected from a group consisting of polysilicon, metal/polysilicon and metal silicide/polysilicon.

* * * * *